United States Patent
Carobolante et al.

(10) Patent No.: US 7,838,964 B2
(45) Date of Patent: Nov. 23, 2010

(54) MICROMODULES INCLUDING INTEGRATED THIN FILM INDUCTORS

(75) Inventors: Francesco Carobolante, San Diego, CA (US); Douglas Alan Hawks, Escondido, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/392,971

(22) Filed: Feb. 25, 2009

(65) Prior Publication Data

US 2009/0212391 A1  Aug. 27, 2009

Related U.S. Application Data

(60) Provisional application No. 61/031,212, filed on Feb. 25, 2008.

(51) Int. Cl.
  *H01L 29/00* (2006.01)
(52) U.S. Cl. .................. 257/531; 257/532; 257/737; 361/760; 361/765
(58) Field of Classification Search ............. 257/531, 257/532, 539, 737, 738; 361/760, 764, 765, 361/767
See application file for complete search history.

(56) References Cited

U.S. PATENT DOCUMENTS

| | | | |
|---|---|---|---|
| 5,541,135 A * | 7/1996 | Pfeifer et al. | 438/108 |
| 6,362,525 B1 * | 3/2002 | Rahim | 257/738 |
| 6,879,111 B2 * | 4/2005 | Voto et al. | 315/169.3 |
| 6,987,307 B2 | 1/2006 | White et al. | |
| 7,084,501 B2 | 8/2006 | Utsunomiya | |
| 7,176,506 B2 | 2/2007 | Beroz et al. | |
| 7,209,011 B2 * | 4/2007 | Welland et al. | 331/36 L |
| 2005/0233593 A1 | 10/2005 | Brunet et al. | |

FOREIGN PATENT DOCUMENTS

| | | |
|---|---|---|
| WO | WO 2008/139392 A2 | 11/2008 |
| WO | WO 2008/152548 A1 | 12/2008 |

OTHER PUBLICATIONS

International Search Report and Written Opinion of the International Searching Authority for PCT Application No. PCT/US2009/035151, mailed Oct. 1, 2009, 11 pages.

N. Wang, et al., "Thin-Film-Integrated Power Inductor on Si and Its Performance in an 8-MHz Buck Converter," IEEE Transactions on Magnetics, Nov. 2008, pp. 4096-4099, vol. 44, No. 11, The IEEE.

T. O'Donnell, et al., "High Efficiency Micro-inductors on Silicon," Conference Presentation at the International Workshop on Power Supply On Chip held in Cork Ireland, Sep. 22-24, 2008, 22 pages, www.powersoc.org.

(Continued)

*Primary Examiner*—Phuc T Dang
(74) *Attorney, Agent, or Firm*—Townsend and Townsend and Crew LLP

(57) ABSTRACT

Micromodules and methods of making them are disclosed. An exemplary micromodule includes a substrate having a thin film inductor, and a bumped die mounted on the substrate and over the thin film inductor.

20 Claims, 4 Drawing Sheets

OTHER PUBLICATIONS

H. Bergveld, et al., "Integrated inductive DC/DC down conversion for integrated power management using a two-die approach," Conference Presentation at the International Workshop on Power Supply on Chip held in Cork Ireland, Sep. 22-24, 2008, 51 pages, www.powersoc.org.

H.J, Bergveld, et al., "An inductive down converter system-in-package for integrated power management in battery-powered applications," The 2008 Power Electronics Specialists Conference (IEEE PESC 2008), Jun. 2008, pp. 3335-3341, The IEEE.

Michael Laflin, "Power Management Dilemma: Footprint vs Performance," IWPC May 2007 Conference in Dussenldorf Germany, May 2007, International Wireless Industry Consurtium, 28 pages.

T. Osaka, et al., "Application of SAM for electroless deposition onto silicon oxide and /or polymer substrates," Presentation at the Electrochemical Society's ECS 210th Meeting, Oct. 29, 2006 in Cancun Mexico, 1 page, The Electrochemical Society.

Z. Hayashi, et al., "Micro DC-DC Converter Chip Size Module," Fuji Electric Review, Fall 2003, pp. 86-88, vol. 49, No. 3.

Enpirion, Inc, "Thermal Note: EN5311/EN5312/EP5352/EP5362/EP5382QI DC-DC Converters," Product Application Note, www.enpirion.com , Apr. 2008, 5 pages.

Enpirion, Inc, "Application Note EN5312QI AN105: Enpirion EN5312QI family of DCDC Converter Module Evaluation Board," Product Application Note, www.enpirion.com , Mar. 2008, 8 pages.

Enpirion Inc , "EN5312QI—1A Synchronous Buck Regulator With Integrated Inductor," Product Brochure, www.enpirion.com , Mar. 2007, 16 pages.

J. Weld, "EN5312QI QFN Package Soldering Guidelines," Enpirion Publication, Enpirion Inc., www.enpirion.com , Jun. 2006, 12 pages.

* cited by examiner

MICROMODULES INCLUDING INTEGRATED THIN FILM INDUCTORS

CROSS-REFERENCES TO RELATED APPLICATIONS

This application claims the benefit of U.S. Provisional Patent Application No. 61/031,212, filed Feb. 25, 2008, which is incorporated herein by reference in its entirety for all purposes.

BACKGROUND OF THE INVENTION

Personal electronic products, such as cell phones, personal data assistants, digital cameras, laptops, etc., are generally comprised of several packaged semiconductor IC chips and surface mount components assembled onto interconnect substrates, or system substrates, such as printed circuit boards and flex substrates. There is an ever increasing demand to incorporate more functionality and features into personal electronic products and the like, while reducing the sizes of these products. Oftentimes, these components require different supply voltages, and/or isolated supply voltages. There is also a need to accomplish all of this while minimizing battery drain. These conflicting factors have placed ever increasing demands on the design, size, and assembly of the interconnect substrates and power distribution components. Some have proposed integrating a switching power supply on a single silicon die as a solution for addressing the above conflicting factors. However, such single chip solutions are expensive, and often do not have power conversion efficiencies that are high enough to justify their costs.

BRIEF SUMMARY OF THE INVENTION

Embodiments of the present invention relate to micromodules, methods for making micromodules, and electrical assemblies including micromodules. These embodiments aid in addressing the above conflicting factors.

A first general embodiment of the present invention is directed to a micromodule comprising a component substrate having a thin film inductor disposed on a first surface of the component substrate, and a semiconductor die mounted on the first surface of the component substrate and located over the thin film inductor. The thin film inductor may comprise a coil shaped trace that lies within a plane. The semiconductor die may be electrically coupled to the component substrate with a plurality of conductive interconnect bumps. A further embodiment may comprise a plurality of interconnect pads disposed on the first surface of the component substrate and located adjacent to one or more sides of the bumped die. The semiconductor die may comprise control circuitry and one or more switches for controlling a current through the inductor. The semiconductor die and the inductor may comprise a switched mode power supply. A further embodiment may comprise a plurality of conductive interconnect bumps disposed on the interconnect pads to provide a wafer level chip scale package (WLCSP).

A second general embodiment of the present invention is directed to a system comprising a micromodule according to the present invention mounted on a system substrate with the first surface of the component substrate of the micromodule facing the system substrate, and with conductive interconnect bumps disposed between the interconnect pads on the component substrate and corresponding interconnect pads on the system substrate. The conductive interconnect bumps may have height dimensions that are larger than the thickness dimension of the semiconductor die. The system substrate may comprise a printed circuit board, a mother board, a flex circuit, and the like.

With the above exemplary constructions, the inductor may be manufactured on an inexpensive substrate while the control circuitry and switch(es) may be manufactured on a relatively small semiconductor die. A small number of processing steps are needed to manufacture on the component substrate, whereas tens of processing steps are generally needed to manufacture the control circuitry and switch(es) on the semiconductor die. Thus, the cost per area of the semiconductor die is higher than the cost per area of the component substrate. By partitioning the circuit between a die and component substrate, lower costs of production can be achieved with the present invention compared to a conventional single-chip solution. Such conventional single chip solutions integrate an inductor with the controller onto the relatively expensive semiconductor die, where the inductor occupies a substantial area of that expensive die. The construction according to the present invention also enables a magnetic material (one with a magnetic permeability greater than that of free space) to be disposed around portions of the inductor to increase its inductance per area value. This, in turn, enables the switching frequency of a switched-mode power supply using the present invention to be significantly reduced. This reduces the switching losses of the switches for the same amount of power transfer, thereby increasing the converter's efficiency.

A third general embodiment of the present invention is directed to a method of making a micromodule, the method comprising: assembling a component substrate comprising a thin film inductor and a semiconductor die together such that the semiconductor die is disposed over the thin film inductor; and assembling a plurality of conductive interconnect bumps on a plurality of interconnect pads disposed on the component substrate and located adjacent to one or more sides of the bumped die. In a further embodiment, a plurality of conductive interconnect bumps are disposed on the semiconductor die prior to assembling the component substrate and the semiconductor die together. A still further embodiment comprises disposing a plurality of conductive interconnect bumps on the conductive interconnect pads of the component substrate. In yet a further embodiment, two or more component substrates are provided together on a common substrate or common wafer, and are singulated after they are assembled with respective semiconductor dice.

With the above exemplary methods, costs of manufacturing switched-mode power supplies may be reduced by manufacturing of high-cost and low-cost components on separate carriers (e.g., semiconductor die and component substrate) and thereafter assembling the carriers together (e.g., co-packaging the carriers). Overall yields can be increased by testing the carriers prior to assembly and only assembling good carriers.

A fourth general embodiment of the present invention is directed to a micromodule comprising: a component substrate comprising a first surface, a second surface, a thin film inductor, and a plurality of vias extending between the first and second surfaces; a first plurality of interconnect pads disposed on the first surface of component substrate, at least two of the first plurality of interconnect pads being electrically coupled to respective vias; a second plurality of interconnect pads disposed on the second surface of component substrate, at least two of the second plurality of interconnect pads being electrically coupled to respective vias; and a semiconductor die disposed on the first surface of the component substrate and electrical coupled to the first plurality of interconnect pads. With this construction, the semiconductor die and the component substrate may have substantially the same lateral dimensions, and may be stacked over one another for a compact micromodule.

A fifth general embodiment of the present invention is directed to a method of making a micromodule, the method comprising: assembling a component substrate comprising a thin film inductor and a semiconductor die together such that the semiconductor die is disposed over a first surface of the component die; and assembling a plurality of conductive interconnect bumps on a plurality of interconnect pads disposed on a second surface of the component substrate.

These and other embodiments of the invention are described below in greater detail with reference to the figures. Features and/or actions of each embodiment disclosed herein may be combined with features and/or actions of other embodiments disclosed herein.

BRIEF DESCRIPTION OF THE DRAWINGS

In the Figures, like numerals designate like elements, and the descriptions of some elements may not be repeated. Exemplary dimensions are shown in the Figures. Embodiments of the invention are not limited to such exemplary dimensions.

DETAILED DESCRIPTION

Figure 1:
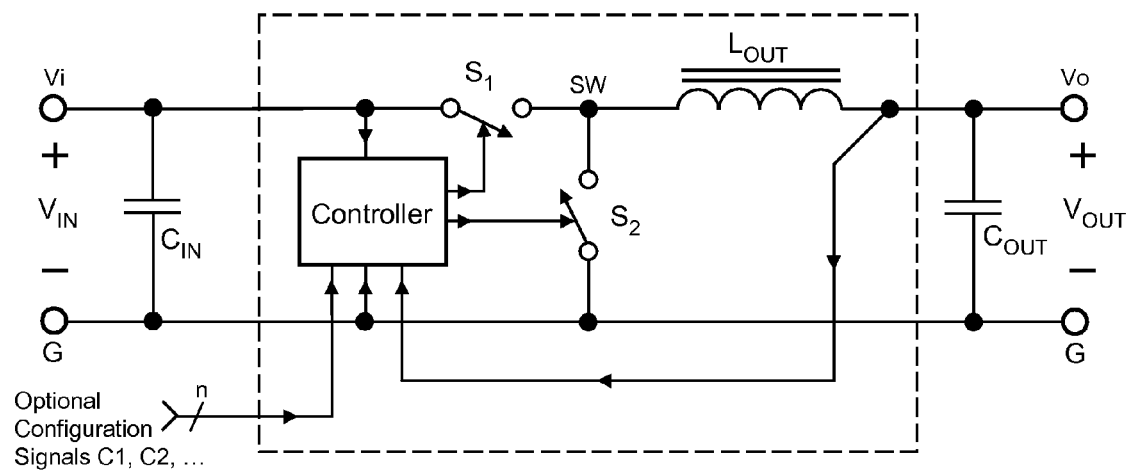
FIG. 1 shows an exemplary buck converter topology that may be implemented in embodiments according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., optocoupler, package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

Some embodiments of the invention include a method of designing a 3D (three-dimensional) micromodule using a base-silicon substrate that has WLCSP (wafer level chip scale package) conductive bumps (e.g., solder balls), circuit interconnects, and a thin film magnetic inductor, and DC/DC converter implemented on a separate silicon die that is assembled with the base-silicon substrate. Some embodiments of the invention are also directed to a method of designing a high switching frequency DC/DC buck converter. Other embodiments of the invention are directed to methods of integrating a base silicon substrate comprising a fabricated thin film magnetic inductor into a micromodule. Yet other embodiments of the invention are directed to methods including a flip chip assembly process. The assembly process can include the integration of a controller die used in a DC/DC converter with a base silicon substrate having an inductor. The method may also include applying WLCSP solder balls or the like to a base silicon substrate carrier.

Some embodiments of the invention include the construction of a very thin form factor, high switching frequency DC-DC buck converter with an integrated thin film magnetic inductor for space constrained portable applications.

Embodiments of the invention have a number of advantages over existing single-chip and micromodule solutions. First, the micromodules according to embodiments of the invention can be smaller than conventional micromodules (e.g., 50% smaller area or footprint as compared to conventional micromodules; and 50% lower height as compared to conventional micromodules). Second, the micromodules can be made less expensively (e.g., lower substrate and assembly cost) than conventional single-chip solutions and micromodules. Third, some embodiments of the invention may also provide EMI (electromagnetic interference) shielding properties (i.e., the smaller the current loop, the easier it is to shield).

The present invention may be used with any type of switched mode power supply (SMPS) known to the art, such as boost converters, buck converters, buck-boost converters, etc. Without loss of generality, embodiments of the invention will be illustrated herein with an exemplary buck converter topology shown in FIG. 1. The exemplary buck converter comprises an input port Vi to receive an input voltage $V_{IN}$ referenced to a common ground G, an output port Vo to provide an output voltage $V_{OUT}$ referenced to the common ground G, an input capacitor $C_{IN}$ coupled in parallel with the input port $V_{IN}$ to filter the input voltage, and an output capacitor $C_{OUT}$ coupled in parallel with the output port $V_{OUT}$ to filter the output ripple current. The output voltage $V_{OUT}$ for the buck converter is less than the input voltage $V_{IN}$. The exemplary buck converter further comprises a switched node SW, an output inductor $L_{OUT}$ coupled between the switched node SW and output port Vo, a primary switch S1 coupled between node SW and the input port Vi, a second switch S2 coupled between node SW and ground G, and a controller that controls the ON/OFF states of switches S1 and S2. The controller periodically switches each of switches S1 and S2 between OFF and ON states, with the each switch being in its OFF state when the other switch is in its ON state. When primary switch S1 is switched ON, it couples voltage and power to inductor $L_{OUT}$, which stores some of the energy and passes some of the energy to the output port Vo. When primary switch S1 is in its OFF state, secondary switch S2 is switched ON, and output inductor $L_{OUT}$ discharges some or all of its stored energy to the output port Vo using secondary switch S2 as a discharge path to the output port. The controller may comprise various analog and digital circuits known to the SMPS art, the details of which do not form part of the present invention. The controller: (1) receives operating power from the input port, (2) monitors the output voltage $V_{OUT}$ relative to a target value, and (3) continually adjusts the relative durations of the ON and OFF states of primary switch S1 to keep the output voltage $V_{OUT}$ close to the target value. Other converter topologies differ from the buck topology in the relative placement of the inductor and switches around the switched node SW. For example, in the boost topology, the inductor is coupled between the input node and the switched node, the primary switch is coupled between the switch node and the common ground, and the secondary switch is coupled between the switched node and the output port (and is usually implemented as a rectifier).

In a first set of embodiments according to the present invention, switches S1 and S2 and the controller are implemented on a semiconductor die, inductor $L_{OUT}$ is implemented on a separate component substrate (which may comprise another semiconductor or silicon die), and the switch/controller die and the component substrate are assembled together. A plurality of optional configuration signals C1, C2, . . . may be provided to the semiconductor die. Such configuration signals may provide individual control signals, or a serial communication bus that can provide many configuration signals from a host processor. The configuration signals may set the target value for the output voltage. In another set of embodiments according to the present invention, at least one of capacitors $C_{IN}$ and $C_{OUT}$ is implemented on the component substrate along with the inductor, preferably on the surface of the substrate that is opposite to the surface on which the inductor is located. In a further embodiment, both of capacitors $C_{IN}$ and $C_{OUT}$ are implemented on the inductor's substrate. In another set of embodiments according to the present invention, at least one of capacitors $C_{IN}$ and $C_{OUT}$ is implemented on a second component substrate (which may comprise another semiconductor die), and assembled with the first component substrate, preferably on the surface opposite to where controller semiconductor die is mounted. In a further embodiment, both of capacitors $C_{IN}$ and $C_{OUT}$ are implemented on the second component substrate. Each of switches S1 and S2 may comprise any type of transistor; in addition, switch S2 may further comprise any type of rectifier device, such as a p-n diode or Schottky barrier rectifier. For low voltage (e.g., less than 3.5 V) applications at low power (e.g., less than 5 watts), switch S1 may comprise a PMOS transistor and switch S2 may comprise an NMOS transistor, which provides low voltage drops across the switches' terminals. This, in turn, provides higher power conversion efficiency since less power is wasted by voltage drops. The NMOS and PMOS transistors may be implemented in a conventional CMOS technology along with the controller.

Figure 2:
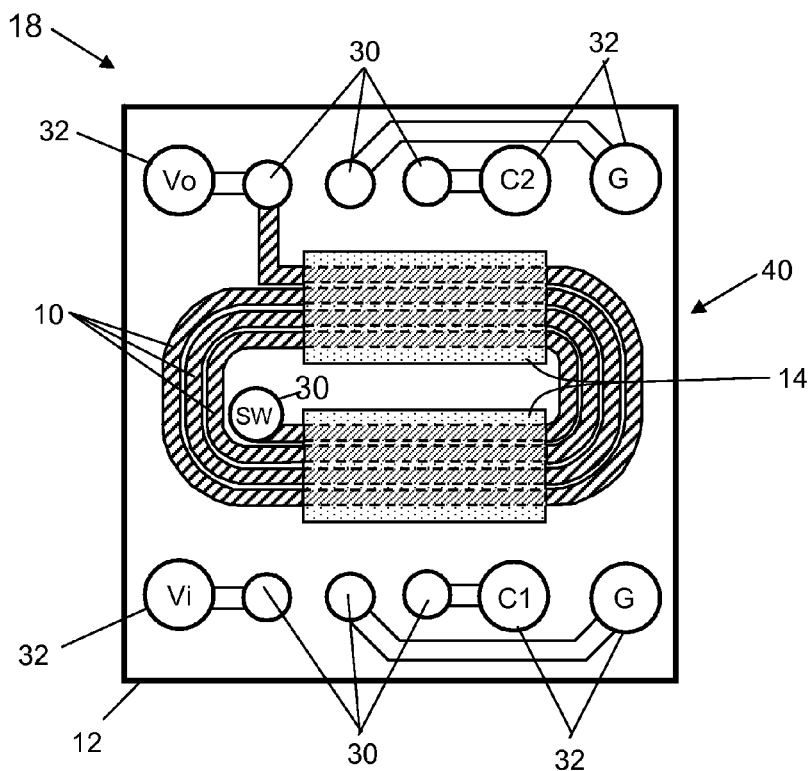
FIG. 2 shows a top plan view of a base substrate according to an embodiment of the present invention.

FIG. 2 shows a top plan view of a component substrate 18 that holds an inductor. Component substrate 18 may comprise a base semiconductor or silicon substrate 12, and a thin film magnetic inductor 40 having copper coils 10 formed on a first surface of substrate 12. Coil 10 may comprise a coiled trace that lies within a horizontal plane. A thin film magnetic material 14 is also shown disposed under and over some segments of the copper coils 10. Material 14 has a magnetic permeability significantly greater than that of free space, and typically more than ten times greater. In contrast, semiconductors, dielectric layers, and most metals used in manufacturing semiconductor die and interconnect substrates have magnetic permeabilities equal to or slightly greater than that of free space. A dielectric layer may be disposed between material 14 and coils 10 for electrical isolation. The substrate 12 also includes a first set of conductive interconnect pads 30 disposed on its first surface for receiving conductive interconnect bumps that electrically couple interconnect pads 30 to corresponding interconnect pads of a semiconductor die (shown in FIGS. 3-5). The substrate 12 also includes a second set of conductive interconnect pads 32 disposed on its first surface for receiving WLCSP conductive interconnect bumps (shown in FIGS. 3-5) that can electrically couple interconnect pads 32 to corresponding interconnect pads of a system substrate. The interconnect pads 32 are marked with the representative respective notations Vi, Vo, G, C1, and C2 to indicate which signals of the power converter shown in FIG. 1 they correspond to in an exemplary implementation. Many of the interconnect pads 30 for coupling to the controller die are coupled to corresponding interconnect pads 32 through respective conductive traces, as shown in the figure. One of the interconnect pads 30 is for coupling the inductor to the switches S1 and S2 on the controller die, and is marked with the signal notation SW.

In typical embodiments, component substrate 18 can be provided in wafer form. The inductor and interconnect pads of component substrate 18 may be formed using standard semiconductor processing techniques. This dramatically reduces manufacturing costs. The inductor may be formed by one of ordinary skill in the art without undue experimentation with the methods disclosed in U.S. published patent application No. 2005-0233593 to Brunet, et al.

Figure 3:
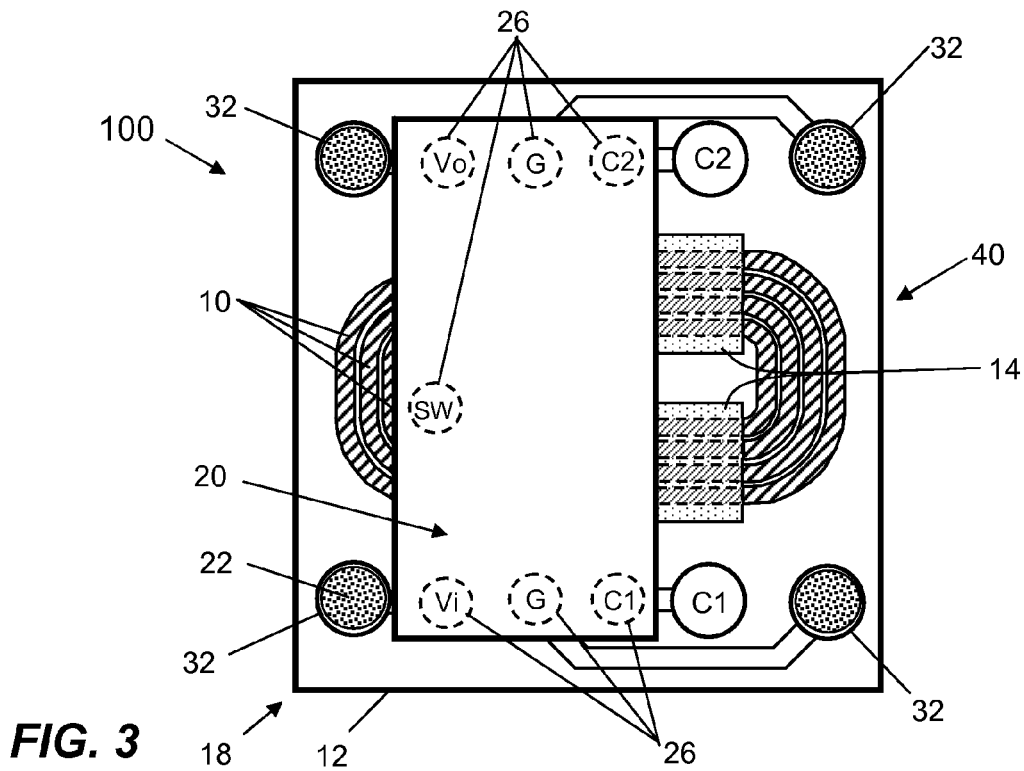
FIG. 3 shows a top plan view of a micromodule embodiment according to an embodiment of the present invention.

FIG. 3 shows a top plan view of a micromodule 100 including a controller die 20 (or controller IC) mounted on the component substrate 18. Micromodule 100 is particularly suitable for a DC/DC Converter. As shown, a first set of conductive bumps 26 (shown by dashed lines) may electrically couple the controller die 20 to the component substrate 18 via the previously described first set of pads 30. A second set of conductive bumps 22 may be disposed on the conductive interconnect pads 32 on the substrate 12, and may surround the controller die 20. The first and second sets of conductive bumps 22, 26 may comprise any suitable conductive material including solder, copper, silver, and/or gold.

Figure 4:
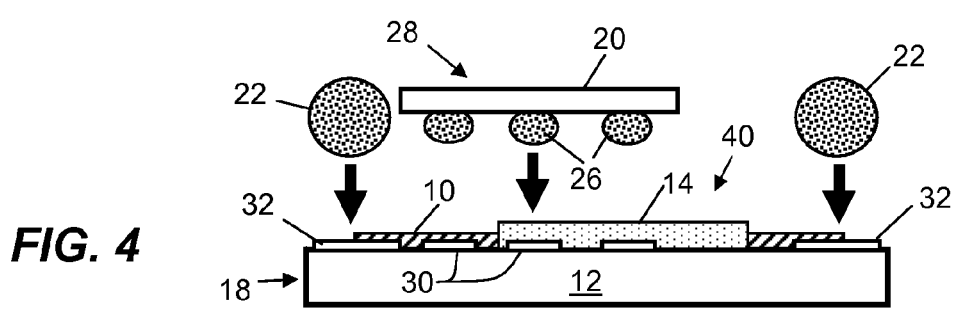
FIG. 4 shows a side view of a micromodule embodiment as it is being formed according to an embodiment of the present invention.

FIG. 4 shows a pre-bumped controller die 28 (which includes the previously described controller die 20 and the first set of conductive bumps 26) being assembled with component substrate 18. The bumped controller die 28 may be flip chip attached to component substrate 18 with the exposed ends of conductive interconnect bumps 26 contacting respective interconnect pads 30. FIG. 4 also shows the second set of interconnect bumps 22 being assembled with component substrate 18, and disposed on respective interconnect pads 32. As shown, the bumps in the second set of conductive bumps 22 are taller than the bumped controller die 28. The second set of conductive bumps 22 may comprise Sn—Ag—Cu WLCSP-type solder bumps or other solder alloys, which may be applied to base silicon substrate 12 while in wafer form. In this case, the formed micromodules can be assembled in parallel on a single wafer, and thereafter singulated into individual units using a saw or other cutting device. Bumps 22 may be assembled with component substrate 18 before or after bumped controller die 28 is assembled with component substrate 18.

Figure 5:
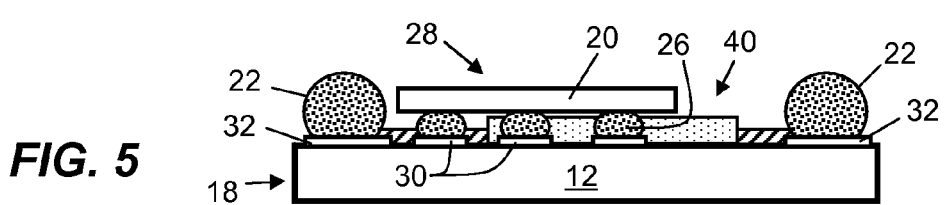
FIG. 5 shows a side view of the micromodule shown in FIG. 3 according to an embodiment of the present invention.

FIG. 5 shows a side view of the micromodule 100 shown in FIG. 3, after the assembly actions. In the figure, it can be seen that the second set of conductive interconnect bumps 22 rise above die 20. This enables micromodule 100 to be flip chip mounted to a system substrate as a chip-scale package (e.g., without a body of molding material encasing die 200 and component substrate 18), with micromodule 100 occupying significantly less space than a conventional single chip solution or conventional packaged solution. Unlike a single-chip solution, a conductive wire crossing under or over the inductor coils is not required since die 20 directly connects to the inductor at the interconnect pad 30 that is labeled "SW" in FIGS. 2-3.

Figure 6:
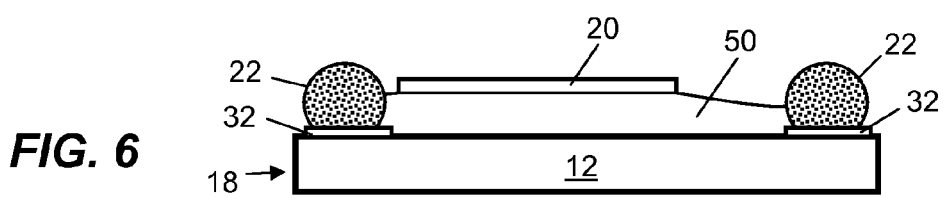
FIG. 6 shows a side view of the micromodule shown in FIG. 3 according to another embodiment of the present invention.

To facilitate the flip-chip assembly process, interconnect bumps 26 may comprise a higher melting point solder than the solder of interconnect bumps 22, or interconnect bumps 26 may comprise ultrasonically bonded bumps, such as ultrasonically bonded gold bumps. This prevents die 20 from shifting its position on component substrate 18 when micromodule 100 is bonded to the system substrate during a reflow process (after flip-chip mounting). To minimize corrosion and oxidation, a body of underfill material may be disposed around the sides of the micromodule 100 after it has been mounted to a system substrate. Referring to FIG. 6, a body 50 of underfill material may be disposed around one or more sides of die 20, and on the exposed portions of coils 10 and magnetic material 14 to minimize corrosion, oxidation, and mechanical damage of these components and the interconnect pads before assembly to a system substrate.

Figure 7:
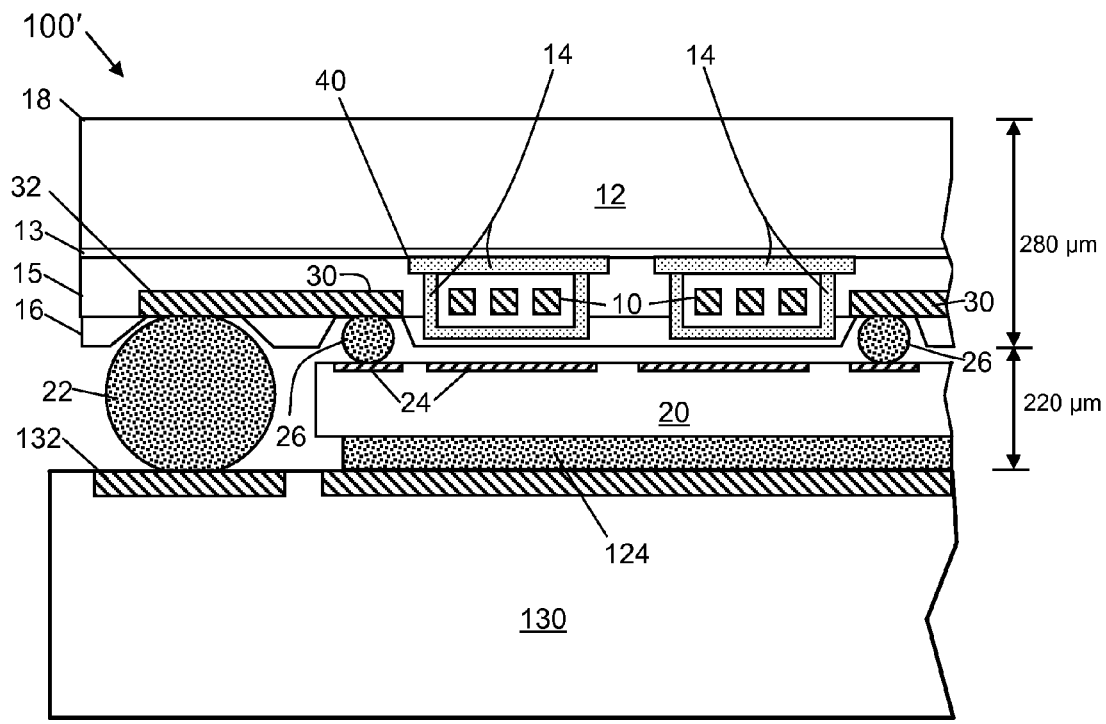
FIG. 7 shows a side view of an assembly including the micromodule shown in FIGS. 3 and 5 according to an embodiment of the present invention.

FIG. 7 shows an electrical assembly (i.e., system) comprising a micromodule 100' embodiment having a similar construction as the one shown in FIGS. 3 and 5, except for closer placement of bumps 26. Micromodule 100' is mounted on a PC board 130 or other circuit substrate. The controller die 20 is optionally attached to the PC board 130 using a conductive adhesive such as solder body 124. The controller die 20 is located between the PC board 130 and the silicon substrate 12, and has conductive region 24 that are electrically coupled to respective interconnect bumps 26. The controller die 20 also overlaps at least a portion of the inductor 40, thereby providing for a space-saving configuration. This embodiment illustrates that component substrate 18 may further comprise: (1) an insulating layer 13 disposed between base semiconductor substrate 12 and inductor 40, (2) a plurality of layers of dielectric material 15 disposed between the metal traces of coil 10 and magnetic material 14 and between interconnect pads 30, 32 and substrate 10, and (3) a top passivation layer 16 disposed over inductor 40 and the electrical traces that couple some of the pads 30, 32 together. This embodiment also illustrates that the height of component substrate 18 may be around 280 microns, the combined height of die 20 and interconnect structures 26, 124 may be around 220 microns, and that the overall as-mounted height of micromodule 100' may be around 500 microns (0.5 mm).

Figure 8:
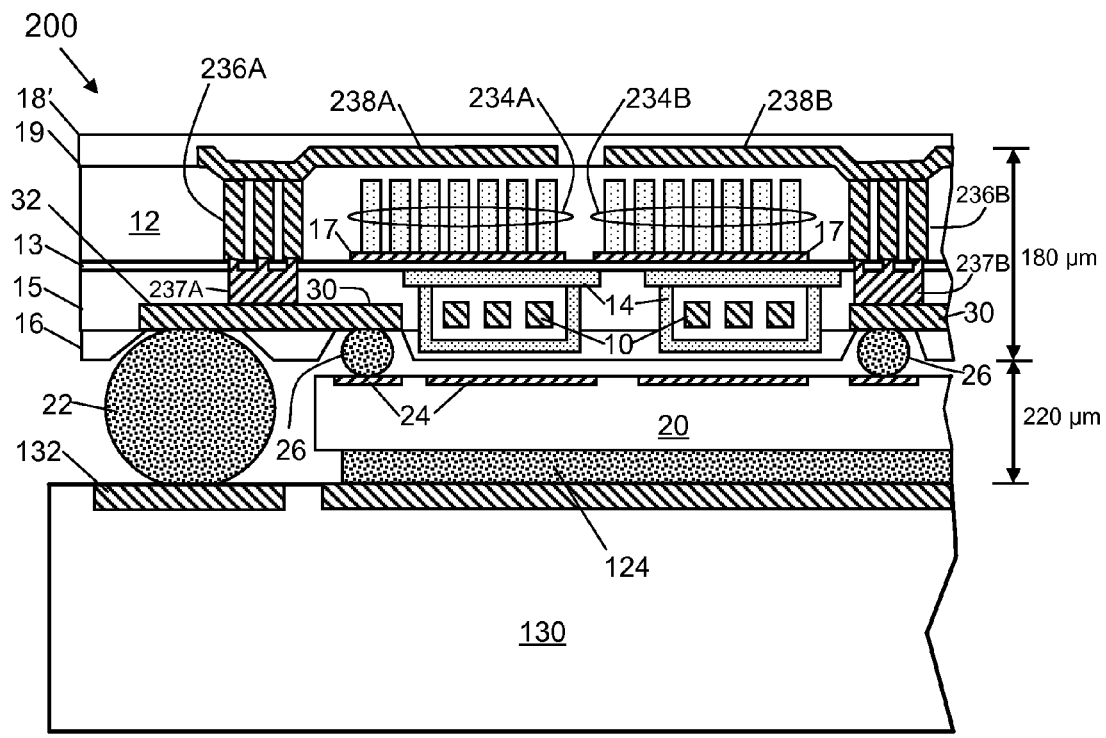
FIG. 8 shows a side view of another assembly embodiment with a different micromodule according to an embodiment of the present invention.

In the above micromodule embodiments, capacitors $C_{IN}$ and $C_{OUT}$ (shown in FIG. 1) are not integrated with the component substrate. These capacitors may be provided by surface mount components disposed on the PC board 130 (system substrate), or may be inherently provided by the interconnect capacitance of the input supply and load. FIG. 8 shows an electrical assembly (i.e., system) like the one shown in FIG. 7 comprising a micromodule 200 mounted on a system substrate 130, except that capacitors are integrated into a component substrate 18' of micromodule 200. More specifically, component substrate 18' comprises the elements of substrate 18 described above, plus the following: (1) capacitors 234A and 234B formed below the top side of the base silicon substrate 12 for capacitors $C_{OUT}$ and $C_{IN}$ (shown in FIG. 1), respectively; (2) inductor 40 above the top surface of base silicon substrate 12; (3) vias 236A and 236B formed through front and back surfaces of component substrate 18' and that are electrically coupled to the interconnect pads 32 for the output port Vo and input port Vi, respectively; and (4) electrical traces 238A and 238B that electrically couple vias 236A and 236B to capacitors 234A and 234B, respectively.

Each of capacitors 234A and 234B may comprise a bank of trench "MOS" (metal-oxide-semiconductor) capacitors that are coupled in parallel, with the semiconductor substrate acting as the ground electrode for the trench MOS capacitors. Component substrate 18' may be made in the following manner. Starting with a doped n-type silicon wafer (generally doped at or above $1 \times 10^{18}$ dopant atoms per cubic centimeter), an oxidation step may be used to create an oxide layer on the top surface of the wafer. The oxide layer is then photo-lithographically patterned as a mask for etching trenches in the top surface of the wafer (which will provide substrate 12). The trenches are formed by anisotropic etching (e.g., plasma etching with a fluorine-based gas and a side-wall passivating gas such as oxygen or hydrogen bromide) from the top of the wafer to a depth of 50 to 100 microns. The trenches are cleaned with aqueous-based etchants, and a thin oxide layer is grown in the trenches by heating the wafer to a temperature over 900° C. in a dry oxygen environment. The oxide-coated trenches are then filled with conductive material. An in situ doped polysilicon material may be used to fill the trenches. The widths of the trenches may be made relative wide (e.g., height-to-width ratio of 4 to 5) to allow the deposited polysilicon to reach the bottoms of the trenches. After deposition, the polysilicon may be annealed to improve its electrical conductivity. Some of the filled trenches are used to provide vias 236A and 236B (these are shows at the distal sides of the capacitors). After annealing the polysilicon, a blanket layer of polysilicon remains on the top surface of the wafer, which can be removed to be flush with the oxide layer, or slightly inset, by a chemical etch. Top ("positive") electrodes 17 for the capacitors 234A and 234B may be formed by depositing a metal layer on the top surface of the wafer, processed the layer with a metal silicide process, optionally depositing another metal layer, and the patterned etching the metal layer(s). These steps form the capacitors except for the backside traces 238A and 238B between the capacitors' ground terminals and vias 236; the backside traces are formed after inductor 40 is formed, as described below. While polysilicon material has been illustrated for the conductive material filled within the trenches, it may be appreciated that some metals may be electrolessly electroplated onto silicon dioxide, and that metal may be electroplated to fill the trenches and to provide a top metal layer on the wafer.

A dielectric layer 13 may then be formed over the top surface of the wafer, and inductor 40 may be formed at the top surface by one of ordinary skill in the art without undue experimentation using the methods disclosed in U.S. published patent application No. 2005-0233593 to Brunet, et al. These steps include forming conductive risers 237 and interconnect pads 30 and 32. In the formation of these components, portions of oxide layer 13 over the centers of vias 236A and 236B are etched away so that metal risers 237A and 237B may be deposited at the ends of the conductive material that is deposited within the trenches of vias 236A and 236B. These riser are electrically coupled to the interconnect pads 32 that receive the ground potential. Additional metal risers may be used to electrically couple the capacitors' positive electrodes 17 to the interconnect pads 32 that receive the input and output voltages. After inductor 40 is formed, the back surface of the substrate is lapped to bring it close to the bottoms of the trenches. Then, portions of the back surface that overlie vias 236A and 236B are etched to uncover the conductive material (e.g., polysilicon) within the via trenches. Traces 238A and 238B may be formed by depositing metal layer over the bottom surface of the wafer, processed the metal with silicide process, optionally depositing additional metal over the silicide, and patterned etching the metal layer(s). Traces 238A and 238B are electrically coupled to the semiconductor material that is disposed around the trenches of 234A and 234B. An electrically insulating layer 19 may be spin coated over the patterned metal layer, and cured. Thus, the capacitors may be integrated into substrate with approximately fifteen processing steps.

While the above embodiment illustrated that both input and output capacitors may be integrated with the component substrate 18', it may be appreciated that only one of the capacitors may be integrated, if so desired. This embodiment illustrates that the height of component substrate 18' may be around 180 microns, the combined height of die 20 and interconnect structures 26, 124 may be around 220 microns, and that the overall as-mounted height of micromodule 200 may be around 400 microns (0.4 mm).

Figure 9:
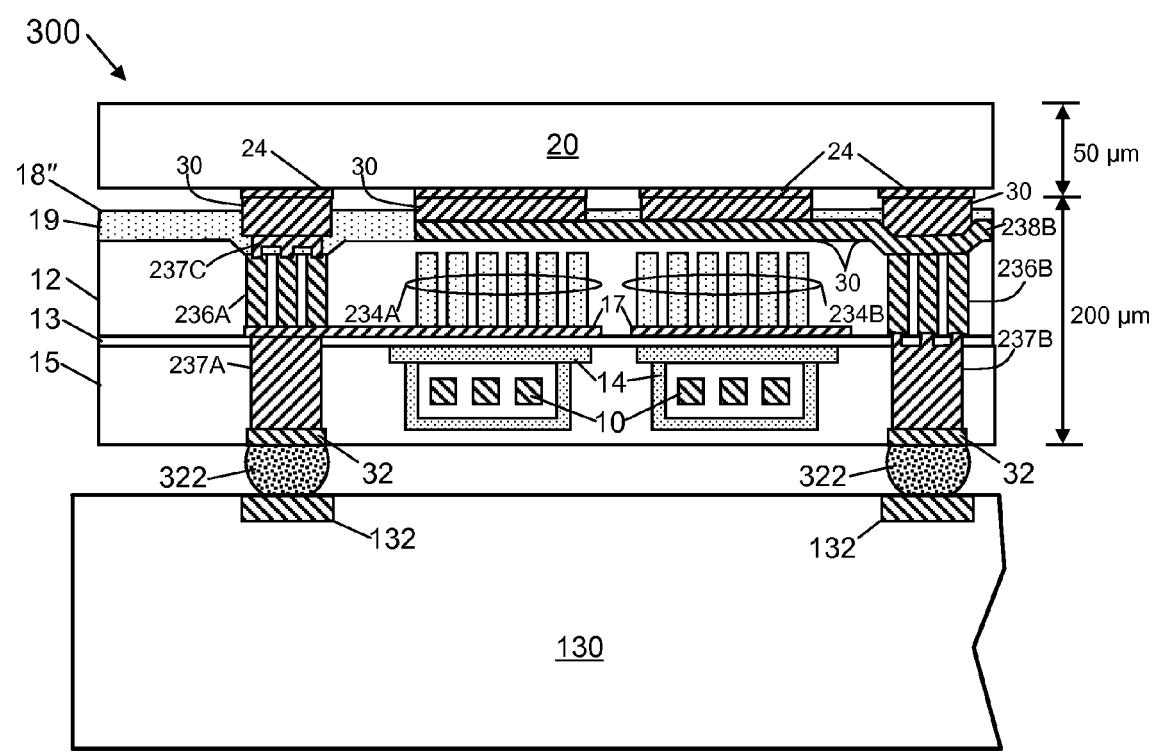
FIG. 9 shows a side view of another micromodule embodiment according to an embodiment of the present invention.

FIG. 9 shows another micromodule 300 according to an embodiment of the invention. In this embodiment, a component substrate 18" has planar dimensions that are substantially equal to the planar dimensions of the controller die 20, and die 20 is stacked on top of component substrate 18", with electrical connections to the system substrate being made at the surface opposite to die 20. Component substrate 18" is similar to component substrate 18' described above, but with the following differences: (1) via 236A provides an input voltage or output voltage instead of ground (via 236B still provides ground potential); (2) interconnect pads 30 are disposed at the back surface of substrate 18" and interconnect vias 236A and 236b to respective electrodes 24 of semiconductor die 20; (3) trace 238A may be omitted and trace 238B may be extended to overlay capacitor bank 234A; (4) electrode 17 for capacitor 234A is extended to the left to overlay riser 237A; (5) a riser 237C is added to contact the conductive material (e.g., polysilicon) of the trenches of via 236A; (6) dielectric layer 15 is thicker and covers the inductor; (7) passivation layer 16 can be omitted; (8) risers 237 are taller, and (9) pads 32 may be made smaller since smaller interconnect bumps 322 can be used. Since interconnect bumps 322 do not have to span the height of die 20, they may be made smaller than interconnect bumps 22. The controller die 20 can have its inputs and outputs electrically coupled to the system substrate 130 by way of the die's conductive regions 24 being electrically coupled to respective pads 30 of substrate 18" by direct metal bonding, where the pads 30 are electrically coupled to respective vias 236, which in turn are electrically coupled to respective risers 237, which in turn are electrically coupled to respective pads 32, which in turn are electrically coupled to respective interconnect bumps 322, which in turn are electrically coupled to respective pads 132 of system substrate 130. The controller die 20 can have its some of its conductive regions 24 coupled to the terminals of the inductor by way coupling to respective pads 30 of substrate 18", where the pads 30 are electrically coupled to respective vias 236, which in turn are electrically coupled to respective risers 237, which in turn are electrically coupled to respective ends of coil 10. Component substrate 18" can be manufactured using the above process flow for manufacturing substrate 18' with some modifications to account for the above changes. Such changes mainly include changes in the processing of the layers at the back side of silicon substrate 10, including the deposition of bond metal for pads 30.

This embodiment illustrates that the height of component substrate 18" may be around 200 microns, the height of die 20 may be around 50 microns, and that the overall as-mounted height of micromodule 300 may be around 250 microns (0.25 mm). Instead of direct metal bonding between die 20 and component substrate 18", solder interconnect bumps may be used, which may increase the thickness of the package to around 300 microns.

Micromodules 100, 100', and 200 may made by assembling component substrate 18, 18' having thin film inductor 40 and semiconductor die 20 together such that die 20 is disposed over the inductor 40, and assembling a plurality of conductive interconnect bumps 22 on the plurality of interconnect pads 32 that are disposed on the component substrate and located adjacent to one or more sides of the bumped die. The conductive interconnect bumps 26 may be disposed on the semiconductor die or on the pads 30 of component substrate 18, 18' prior to assembling the component substrate and the semiconductor die together. The conductive interconnect bumps 22 may be disposed on the conductive interconnect pads 32 of the component substrate before or after assembling the component substrate and die together. Two or more component substrates may be provided together on a common substrate or common wafer, and may be singulated (e.g., separated) after they are assembled with respective semiconductor dice.

Micromodule 300 may be made by assembling component substrate 18", with its thin film inductor 40, and semiconductor die 20 together such that the semiconductor die is disposed over a first surface of the component die, and assembling a plurality of conductive interconnect bumps 322 on a plurality of interconnect pads 32 disposed on a second surface of the component substrate.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Any one or more features of one or more embodiments may be combined with one or more features of any other embodiment without departing from the scope of the invention.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A micromodule comprising:
   a component substrate comprising a thin film inductor, the thin film inductor comprising a coiled electrical trace and a layer of magnetic material disposed adjacent to at least a portion of the coiled electrical trace, wherein the magnetic permeability of the magnetic material is more than ten times greater than that of free space; and
   a bumped semiconductor die disposed on the component substrate and over the thin film inductor.

2. The micromodule of claim 1, wherein the bumped die is disposed on a first area of the component substrate, and wherein the micromodule further comprises a plurality of interconnect pads disposed on the component substrate and around the first area.

3. The micromodule of claim 1, wherein the component substrate comprises silicon.

4. The micromodule of claim 1, wherein the semiconductor die comprises a controller die that controls the flow of current through the inductor.

5. The micromodule of claim 1, wherein the bumped die comprises a conductive region that is coupled to a terminal of the thin film inductor by a conductive interconnect bump.

6. The micromodule of claim 1, wherein the thin film inductor is disposed at the first surface of the component substrate, wherein the bumped semiconductor die is mounted at the first surface of the component substrate, and wherein the component substrate further comprises at least one capacitor that has at least one terminal disposed on at least a portion of the second surface of the component substrate.

7. The micromodule of claim 6, wherein the component substrate further comprises a doped semiconductor substrate, wherein the at least one capacitor comprises at least one trench capacitor formed in the second surface of the component substrate.

8. The micromodule of claim 6, wherein the component substrate further comprises a via disposed between its first and second surfaces, and wherein at least one terminal of the at least one capacitor is electrically coupled to the via.

9. The micromodule of claim 1, wherein the component substrate comprises:
   a first surface having a first area;
   a first plurality of interconnect pads disposed in the first area and to which the bumped die is attached;
   a second plurality of interconnect pads disposed on the first surface of component substrate and around the first area; and
   at least one electrically trace electrically coupling a pad of the first plurality of interconnect pads to a pad of the second plurality of interconnect pads.

10. An electrical assembly comprising a system substrate, and the micromodule of claim 2 mounted to the system substrate, wherein the bumped semiconductor die is disposed between the component substrate and the system substrate.

11. The electrical assembly of claim 10, wherein a surface of the bumped semiconductor die is electrically coupled to a conductive pad of the system substrate.

12. A micromodule comprising:
   a component substrate comprising a first surface, a second surface, a thin film inductor, and a plurality of vias extending between the first and second surfaces, the thin film inductor comprising a coiled electrical trace and a layer of magnetic material disposed adjacent to at least a portion of the coiled electrical trace, wherein the magnetic permeability of the magnetic material is more than ten times greater than that of free space;
   a first plurality of interconnect pads disposed on the first surface of component substrate, at least two of the first plurality of interconnect pads being electrically coupled to respective vias;
   a second plurality of interconnect pads disposed on the second surface of component substrate, at least two of the second plurality of interconnect pads being electrically coupled to respective vias; and
   a semiconductor die disposed over the first surface of the component substrate and electrical coupled to the first plurality of interconnect pads.

13. The micromodule of claim 12, wherein the inductor is disposed at the second surface of the component substrate.

14. The micromodule of claim 12, wherein the component substrate comprises silicon.

15. The micromodule of claim 12, wherein the semiconductor die comprises a controller die that controls the flow of current through the inductor.

16. The micromodule of claim 12, wherein the semiconductor die comprises a conductive region that is coupled to a terminal of the thin film inductor.

17. The micromodule of claim 12, wherein the thin film inductor is disposed at the second surface of the component substrate, and wherein the component substrate further comprises a capacitor that has a terminal disposed on at least a portion of the first surface of the component substrate.

18. The micromodule of claim 17, wherein the component substrate comprises further a doped semiconductor substrate, wherein the capacitor comprises at least one trench capacitor formed in the first surface of the component substrate.

19. The micromodule of claim 17, wherein the terminal of the capacitor faces the semiconductor die and is electrically coupled to the semiconductor die.

20. An electrical assembly comprising a system substrate, and the micromodule of claim 12 mounted to the system substrate, wherein the component substrate is disposed between the semiconductor die and the system substrate.

* * * * *